(12) United States Patent
Nanba

(10) Patent No.: US 8,610,269 B2
(45) Date of Patent: Dec. 17, 2013

(54) SEMICONDUCTOR DEVICE, METHOD FOR MANUFACTURING SEMICONDUCTOR DEVICE, AND CIRCUIT DEVICE USING SEMICONDUCTOR DEVICE

(75) Inventor: Kenji Nanba, Tokyo (JP)

(73) Assignee: NEC Corporation, Tokyo (JP)

( * ) Notice: Subject to any disclaimer, the term of this patent is extended or adjusted under 35 U.S.C. 154(b) by 77 days.

(21) Appl. No.: 13/379,273

(22) PCT Filed: Jun. 23, 2010

(86) PCT No.: PCT/JP2010/061082
§ 371 (c)(1),
(2), (4) Date: Dec. 19, 2011

(87) PCT Pub. No.: WO2010/150912
PCT Pub. Date: Dec. 29, 2010

(65) Prior Publication Data
US 2012/0104602 A1    May 3, 2012

(30) Foreign Application Priority Data
Jun. 24, 2009   (JP) ................................ 2009-149945

(51) Int. Cl.
*H01L 23/485* (2006.01)
(52) U.S. Cl.
USPC ........... 257/737; 257/664; 257/734; 257/786; 257/E29.111; 257/E23.021
(58) Field of Classification Search
USPC .................. 257/664–665, 734–786, 257/E29.111–E29.165, E23.01–E23.079, 257/E23.141–E23.179
See application file for complete search history.

(56) References Cited

U.S. PATENT DOCUMENTS

| | | | |
|---|---|---|---|
| 7,960,830 B2* | 6/2011 | Lu | 257/737 |
| 2005/0098901 A1* | 5/2005 | Chang et al. | 257/780 |
| 2005/0194682 A1* | 9/2005 | Ohuchi et al. | 257/737 |
| 2007/0045841 A1* | 3/2007 | Cho et al. | 257/737 |
| 2009/0166857 A1* | 7/2009 | Lee | 257/737 |
| 2010/0148362 A1* | 6/2010 | Sakurai | 257/737 |
| 2010/0313416 A1* | 12/2010 | Meura | 29/874 |
| 2011/0058346 A1* | 3/2011 | Lee et al. | 361/783 |
| 2011/0089577 A1* | 4/2011 | Eom et al. | 257/778 |
| 2011/0193219 A1* | 8/2011 | Lai et al. | 257/737 |
| 2011/0298123 A1* | 12/2011 | Hwang et al. | 257/737 |

FOREIGN PATENT DOCUMENTS

| | | |
|---|---|---|
| JP | 5-291262 A | 11/1993 |
| JP | 2001077145 A | 3/2001 |

(Continued)

OTHER PUBLICATIONS

International Search Report for PCT/JP2010/061082 mailed Jul. 27, 2010.

*Primary Examiner* — Mamadou Diallo

(57) ABSTRACT

[Problem] A semiconductor device which achieves a fine pitch, a high throughput and a high connection reliability, especially in flip-chip mounting is provided. A method for manufacturing the semiconductor device and a circuit device using the semiconductor device are also provided.

[Means for solving the problem] The semiconductor device has: an electrode; an insulating part having an opening on the electrode; a protruding part formed on the electrode; a protecting part which is formed at the periphery of the protruding part and electrically isolates the protruding part; and a bonding part which is formed on the protecting part by being spaced apart from the protruding part. An upper surface of the protruding part, an upper surface of the protecting part, and an upper surface of the bonding part form the same plane.

11 Claims, 9 Drawing Sheets

(56) References Cited

U.S. PATENT DOCUMENTS

JP 2003086626 3/2003
JP 2004172491 6/2004
JP 2005129874 5/2005
JP 2005294430 10/2005
JP 2007142232 6/2007
JP 2008244383 10/2008

* cited by examiner

FIG.2A
FIG.2B
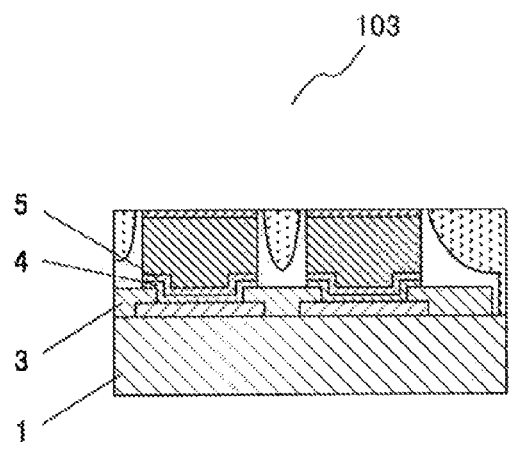
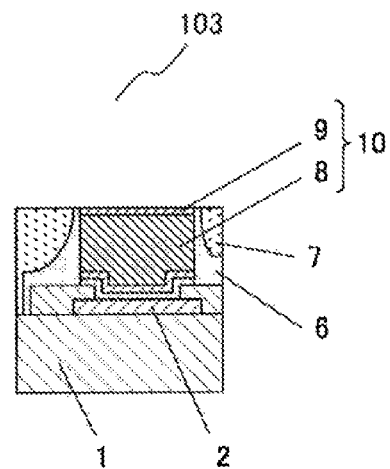

SEMICONDUCTOR DEVICE, METHOD FOR MANUFACTURING SEMICONDUCTOR DEVICE, AND CIRCUIT DEVICE USING SEMICONDUCTOR DEVICE

TECHNICAL FIELD

The present invention relates to a semiconductor device and a method for manufacturing the semiconductor device. Particularly, the present invention relates to a semiconductor device which achieves a fine pitch, a high throughput and high connection reliability in a flip-chip mounting, a method for manufacturing the semiconductor device, and a circuit device which uses the semiconductor device.

BACKGROUND ART

In recent years, as a package structure suitable for a superior performance and a sophisticated function of a semiconductor device, the SiP (System in Package) structure is well known. According to the SiP structure, a system is built by laminating a plurality of semiconductor elements such as a CPU (central processing unit), a memory or the like, and by mounting the laminated semiconductor elements on a package. Moreover, according to the SiP structure, it has been progressed in recent years to make pins further increasing and to make a pitch between electrodes finer in order to improve capability of transferring data between the semiconductor elements.

FIGS. 9A and 9B show an example of a method for manufacturing a semiconductor device according to a related art.

Firstly, two semiconductor devices 1101 are arranged so as to be opposed to each other. For each semiconductor device 1101, a solder bump 15, whose main constituent is tin (Sn), is formed on an electrode 2 of a semiconductor element 1 through a barrier metal 14. Or, a thin film made of gold (Au) may be formed on the barrier metal 14 of one of the semiconductor elements 1 (FIG. 9A). Afterward, the solder bumps 15 existing at the corresponding positions are touched each other, then heated, and pressed. As a result, the solder bumps react, and are connected to each other. Finally, underfill resin having thermal hardening properties is filled between two semiconductor elements 1. The underfill resin changes to a bonding resin layer 7 in the hardening process. Through carrying out the above-mentioned processes, a circuit device 1201 is obtained (FIG. 9B).

In order to improve the productivity, Japanese Patent Application Laid-Open No. 2007-142232 (patent document 1) discloses a manufacturing method to mount a semiconductor element after making liquid resin flow on the substrate side, and then to connect electrodes to each other and to carry out a thermal hardening process for the resin.

Japanese Patent Application Laid-Open No. 2005-294430 (patent document 2) discloses a manufacturing method to supply resin before mounting a semiconductor element. Specifically, the patent document 2 discloses a manufacturing method to form a bonding resin layer, which is in a semi hard state, on the semiconductor element side, and to make the surface of a solder bump exposed from the bonding resin layer through grinding the solder bump and the bonding resin layer afterward and to make a surface of the semiconductor element flat.

Japanese Patent Application Laid-Open No. 2004-172491 (patent document 3) discloses structure wherein a surface of a projecting electrode and a surface of a stopper mask layer are made flush. Moreover, the patent document 3 discloses that thermoplastic resin or low softening point (melting point) glass, which has adhesive properties, is applied to the stopper mask layer.

RELATED ART DOCUMENT

Patent Document

[Patent document 1] Japanese Patent Application Laid-Open No. 2007-142232
[Patent document 2] Japanese Patent Application Laid-Open No. 2005-294430
[Patent document 3] Japanese Patent Application Laid-Open No. 2004-172491

DISCLOSURE OF THE INVENTION

Problem to be Solved by the Invention

However, the structure according to the related art has several problems.

The first problem is that a void tends to occur due to a decline in the filling properties of the underfill resin. The void occurs since a distance between the bumps becomes short and a height of the bump becomes low and a gap between the semiconductor elements becomes narrow due to the increasing pins and the fine pitch between the electrodes. In the case that the gap between the semiconductor elements is narrow, a difference between a filling speed of entering into a filling area and a speed of flowing around an edge of the semiconductor element becomes remarkable. As a result, the void occurs due to involving air. Moreover, the speeds of filling the underfill resin in a bump arranging area and in other area are different from each other also in the filling area. As a result, the void tends to occur in a bump connecting area.

The second problem is that a productivity of assembling a package is low. The reason is that a process to mount the semiconductor element and a process to fill the underfill resin are carried out separately. Moreover, the productivity becomes low since a filling time is affected through adjusting a condition such as a viscosity of the underfill resin, an amount of coating or the like, and each of the underfill filling processes is carried out separately.

According to the manufacturing method described in the patent document 1, air may be easily involved between the semiconductor element and the resin, when mounting the semiconductor element. As a result, the void tends to occur within the resin. In the case of the fine pitch and the narrow gap, it is difficult to discharge air involved by using a flow of the resin before the resin thermal-hardening process. There is another problem that since the resin is coated in advance on the substrate including the electrode, the resin is interposed between joining parts, and consequently a connection area of the electrode becomes small.

According to the manufacturing method described in the patent document 2, there is a fear to generate a scraped sag on the solder bump when scraping, since the bonding resin layer in the semi hard state, and the solder bump made of metal, are different from each other in the hardness. Accordingly, in the case that the pitch between the electrodes becomes fine, there is a possibility that the scraped sag causes a short circuit to an adjacent bump. Moreover, since the size of the electrode also becomes fine according to the fining, there is another problem that influence due to a variation in plate at a time of forming the bump becomes remarkable.

While the patent document 3 describes that the thermoplastic resin or the low softening point (melting point) glass, which has the adhesive properties, is applied to the stopper mask layer, the patent document 3 does not take accoung of insulation between the electrodes. It is necessary to take the insulation between the electrodes into account, together with the adhesion between the electrodes in order to make the pitch between the projecting electrodes fine.

An object of the present invention is to provide a semiconductor device which solves the problem mentioned above, a method for manufacturing the semiconductor device, and a circuit device using the semiconductor device.

Measures for Solving the Problem

As a first viewpoint, a semiconductor device having an electrode according to the present invention includes an insulating part having an opening on the electrode, a protruding part formed on the electrode, a protecting part formed at a periphery of the protruding part and isolating electrically the protruding part, and a bonding part formed on the protecting part spaced apart from the protruding part. An upper surface of the protruding part, an upper surface of the protecting part and upper surface of the bonding part form a same plane.

Here, the upper surface of each element or each member means a surface which exists on a top end of each element or each member and is exposed to the outside.

As a second viewpoint, a method for manufacturing a semiconductor device according to the present invention includes a step of forming an insulating part on a semiconductor element having an electrode, the insulating part having an, opening on the electrode, a step of forming a main material part of a protruding part on the electrode, a step of forming a protecting part on the insulating part and the main material part, a step of supplying material of a bonding part on the protecting part, and a step of carrying out a flattening process so that a surface of the main material part, a surface of protecting part in a periphery of the main material part and a surface of the bonding part form a same plane.

As a third viewpoint, a method for manufacturing a semiconductor device according to the present invention includes a step of forming an insulating part on a semiconductor element having an electrode, the insulating part having an opening on the electrode, a step of forming a main material part of a protruding part on the electrode, a step of forming a protecting part on the insulating part and the main material part, a step of carrying out a flattening process so that a surface of the main material part and a surface of the protecting part in a periphery of the main material part form a same plane, a step of removing a protecting part formed on a dicing line, a step of supplying material of a bonding part, and a step of shaping the bonding part by using a mask.

As a fourth viewpoint, a circuit device according to the present invention includes a semiconductor device which has an electrode. The semiconductor device includes an insulating part having an opening on the electrode, a protruding part formed on the electrode, a protecting part formed at a periphery of the protruding part and isolating electrically the protruding part, and a bonding part formed on the protecting part spaced apart from the protruding part. An upper surface of the protruding part, an upper surface of the protecting part and upper surface of the bonding part form a same plane.

Effect of the Invention

According to the semiconductor device, especially in the flip-chip mounting, it is possible to achieve the high connection reliability together with the fine pitch and the high throughput.

BRIEF DESCRIPTION OF THE DRAWINGS

FIG. 2 is a schematic cross section view showing an example of structure of a semiconductor device according to a second embodiment of the present invention.

DESCRIPTION OF EMBODIMENTS

More specific exemplary embodiment will be described in the following with reference to a drawing.

First Exemplary Embodiment

[Semiconductor Device]

Figure 1A:
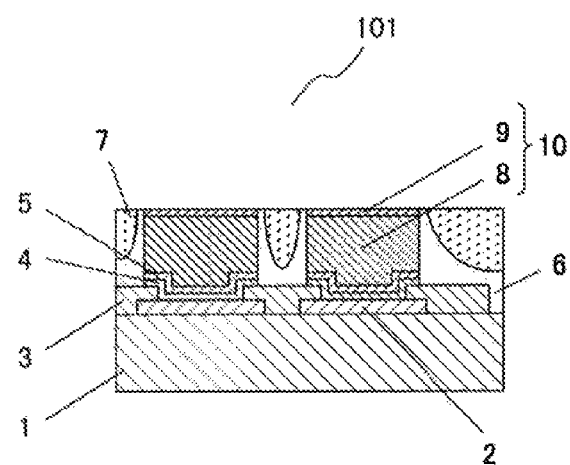
FIG. 1 is a schematic cross section view showing an example of structure of a semiconductor device according to a first embodiment of the present invention.
Figure 1B:
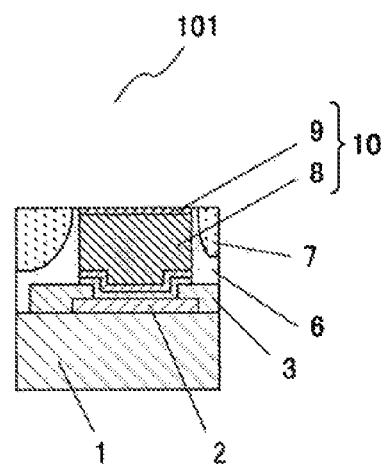

A semiconductor device according to an exemplary embodiment 1 of the present invention will be described in detail with reference to FIG. 1. FIG. 1 shows an example of a cross section view of a semiconductor device 101 according to the exemplary embodiment 1 of the present invention. Here, FIG. 1A and FIG. 1B are cross section views showing cross sections of two kinds of the collectively manufactured semiconductor devices, which are cut and separated with a dicing method (refer to a manufacturing method mentioned later).

According to each of FIG. 1A and FIG. 1B, an electrode 2 and an insulating film 3 (insulating part) of such as silicon oxide nitride (SiON) or silicon oxide (SiO2), which has an opening on the electrode 2, are arranged on a circuit plane of the semiconductor device 1, a main material part 8 of a bump 10 (protruding part) made of copper (Cu) is arranged on the electrode 2, and a joining material part 9, in a shape of film and made of such as Sn or Au, is formed on a surface of the main material part 8 of the bump 10. Moreover, the insulating film 3 and a periphery of the bump 10 are covered with a protecting film 6 (protecting part) which has high insulation property. Here, organic resin such as polyimide, or an inorganic film, made of SiON, SiO or the like similarly to the insulating film 3, is applied to the protecting film 6.

Here, an adhering layer 4 and a bonding layer 5 are formed between the electrode 2 (including a portion of the insulating film 3) and the main material part 8 of the bump 10.

Moreover, a bonding resin layer 7 (bonding part), in a semi hard state, is arranged on the protecting film 6 except for the periphery of the bump 10. A surface of the joining material part 9, a surface of the protecting film 6 at the periphery of the bump 10 and a surface of the bonding resin layer 7 form the same plane. The bonding resin layer 7 includes thermal hardening resin, thermoplastic resin or combined type resin of the thermal hardening and photosensitivity.

According to the semiconductor device of the present exemplary embodiment, since the bonding resin layer is formed on a portion of a surface of the semiconductor device, it is unnecessary to carry out the underfill resin filling process to the joining part. As a result, it is possible to achieve the high productivity. Moreover, since the surface of the joining material part of the bump is exposed from the bonding resin layer, and the surface of the joining material part and the surface of the bonding resin layer form the same plane, an inferior joining due to interposition of the resin on mounting the component can be suppressed. Furthermore, since the periphery of the bump is covered with the protecting film having the high insulation properties, high insulation between the adjacent bumps can be secured for the electrodes with the fine pitch.

[Method for Manufacturing Semiconductor Device]

Figure 3A:
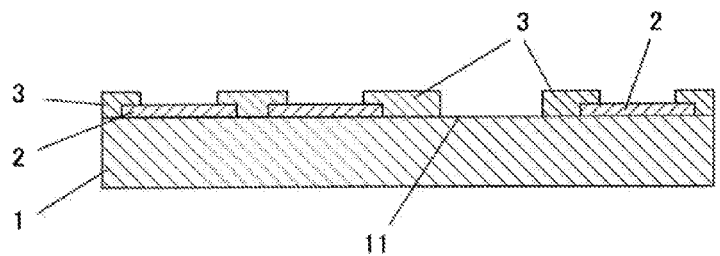
FIG. 3 is a schematic cross section view showing an example of a method for manufacturing the semiconductor device according to the first and the second exemplary embodiments of the present invention.

A method for manufacturing the semiconductor device according to the first exemplary embodiment of the present invention will be described with reference to FIGS. 3 and 4. FIG. 3A shows a state where the semiconductor element 1, including a plurality of semiconductor devices, is mounted on a surface of a wafer. The electrode 2 made of aluminum (Al) or the like, the insulating film 3 made of SiON, SiO2 or the like, having an opening on a portion of the electrode 2 and covering the circuit plane, are disposed on the circuit plane of the semiconductor device. Here, the semiconductor element 1 is cut along a dicing line 11 (in the longitudinal direction in the figure) in a final process of the manufacturing method according to the present exemplary embodiment, and consequently a plurality of semiconductor devices are manufactured.

Figure 3B:
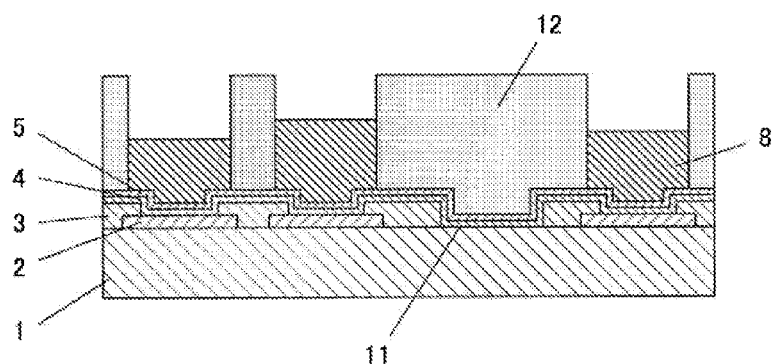

Next, the adhering layer 4 made of titanium (Ti), titanium tungsten alloy (TiW) or the like, and the bonding layer 5 made of Cu or the like, are formed, with the sputtering method or the like, on a whole of surfaces of the electrode 2 and the insulating film 3. Then, a photosensitive resist 12 is supplied on the bonding layer 5 by the spin coat or the like, and further the resist 12 is exposed and developed, thereby an opening is formed in a desired area on the electrode 2. Moreover, Cu, which will be the main material part 8 of the bump 10, is extracted on the opening of the resist 12 according to the electrolysis plating method or the like, and a structure shown in FIG. 3B is obtained. At this time, heights of the main material part 8 on the electrode 2 may vary among the electrodes 2.

Figure 3C:
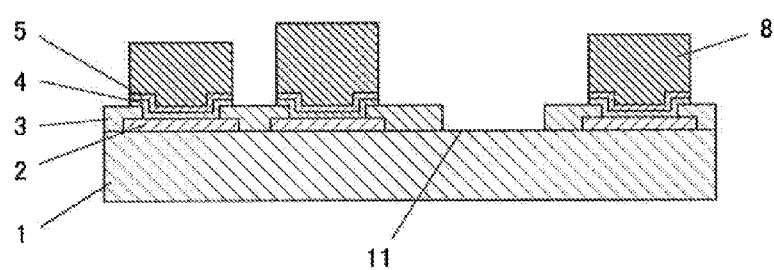

Afterward, the resist 12 is removed, and the adhering layer 4 and the bonding layer 5, which are formed in the area except for the area covered with the main material part 8, are removed with the wet etching method or the like, and consequently structure shown in FIG. 3C is obtained.

Figure 3D:
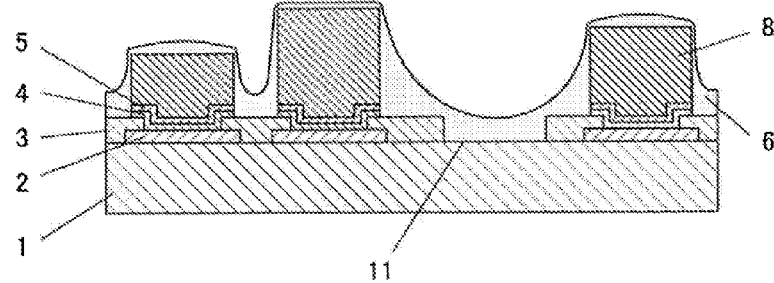

Next, the organic resin, such as the thermal hardening type or the photosensitive type polyimide, is supplied on the whole surface of the semiconductor element 1, which includes the surface of the main material part 8, by the spin coat or the like. The protecting film 6 is formed through carrying out the hardening process for the organic resin (FIG. 3D). An amount of the resin to be supplied is preferably the amount such that thickness of the formed protecting film 6, which touches the insulating film 3, is not more than a half of the height of the bump 10 (main material part 8 and joining material part 9) for which the final process is carried out. In the case that SiON or SiO2 is applied to the protecting film 6, the resin is supplied with the sputtering method. It is desirable in this case that the thickness of the protecting film 6 is not more than 1 micrometer.

Figure 4E:
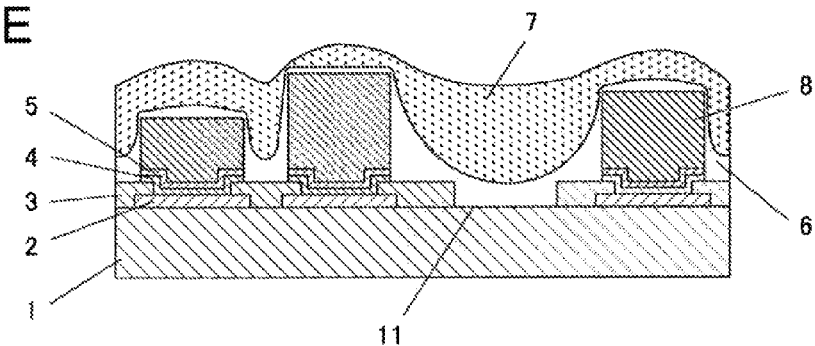
FIG. 4 is a schematic cross section view showing an example of a method for manufacturing the semiconductor device according to the first exemplary embodiment of the present invention.

Afterward, resin which changes to the bonding resin layer 7 is supplied on the protecting film 6 (FIG. 4E). In the case that the thermal hardening resin or the thermoplastic resin is applied to the bonding resin layer 7, resin in a shape of film is laminated on the protecting film 6. Here, in the case that the thermal hardening resin is applied, the resin is still in the semi hard state after being laminated.

As a method to supply the bonding resin layer 7, a method of forming the bonding resin layer 7 in the semi hard state through supplying liquid type thermal hardening resin on the protection film 6 by the spin coat or the like, and heating the resin may be adopted. Moreover, in the case that the thermal hardening and photosensitive resin is applied to the bonding resin layer 7, a method of forming the bonding resin layer 7 in the semi hard state through supplying the resin by the spin coat or the like and exposing the resin may be adopted.

Figure 4F:
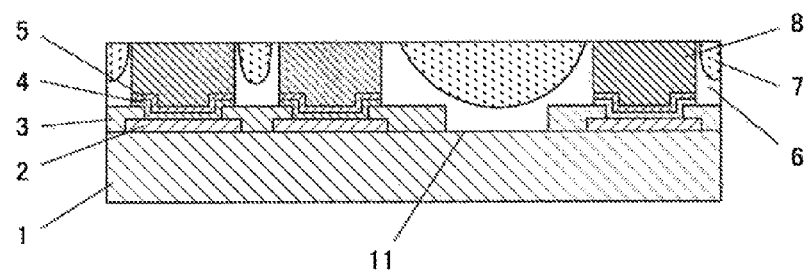
Figure 4G:
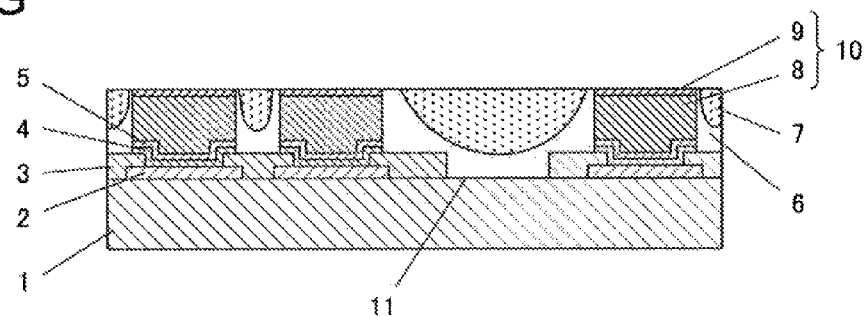

Next, a flattening process is carried out for the bonding resin layer 7, the protecting film 6 and the main material part 8 of the bump 10 with the polishing method, the grinding method, the chemical mechanical polishing method or the like (FIG. 4F). Furthermore, metal which will be the thin film shape joining material part 9 is supplied on the exposed surface of the main material part 8 with the electroless plating method or the like (FIG. 4G). Here, in the case that the electroless plating method is adopted, the joining material part 9, which has the desired plating thickness, may be supplied by use of the immersion plating bath. Moreover, it may be preferable that Au or Sn may be applied to the joining material part 9.

Figure 4H:
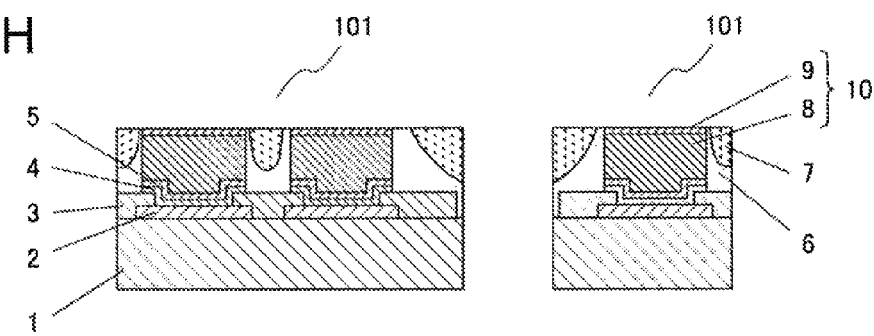

Finally, through carrying out a dicing process along the dicing line 11, the wafer is cut into a plurality of pieces. Through carrying out the dicing process, the semiconductor device 101 according to the exemplary embodiment 1 of the present invention is produced (FIG. 4H). Moreover, a back surface of the semiconductor element 1 may be processed with the polishing method or the like so that the wafer may have the desired thickness, and afterward the dicing process is carried out.

According to the manufacturing method of the exemplary embodiment of the present invention, it is possible to achieve a high productivity through supplying the bonding resin layer all together on the wafer. Moreover, through carrying out the process for flattening the bump in a state where the periphery of main material part of the bump is covered with the protecting film which has already become hard, the bump from sagging when processing an be suppressed, and a short circuit between the adjacent bumps even in the case of the fine electrode pitch is prevented. Moreover, through forming a thin joining material part after the process for flattening the bump, it is possible to restrain the plating thickness from varying and the shape of the bump which has the high joining reliability can be obtained. Furthermore, through applying the electroless plating method by use of the immersion plating bath in supplying the joining material part, it is possible to supply the joining material part while maintaining the flatness with the bonding resin layer.

[Circuit Device]

Figure 8A:
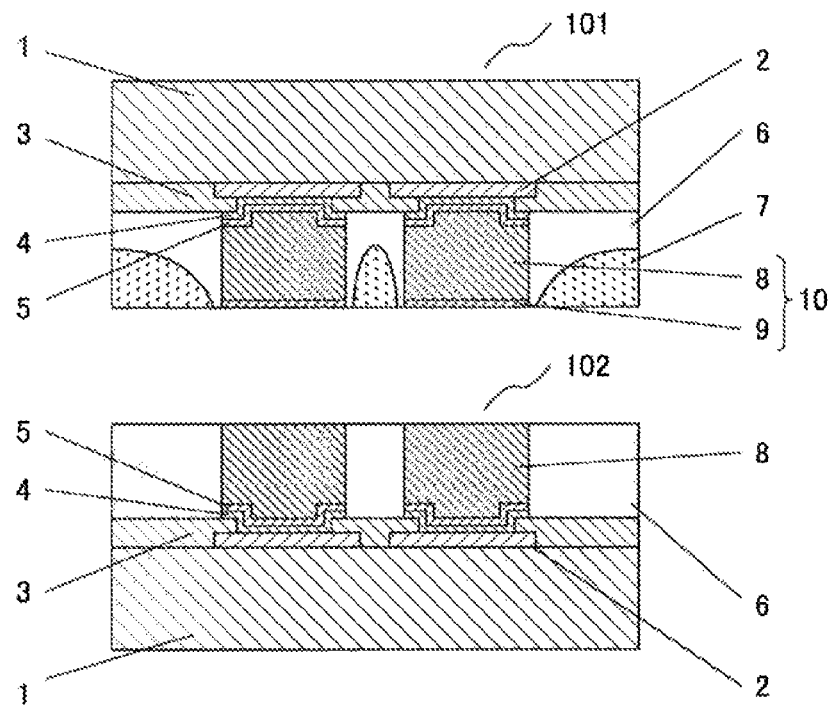
FIG. 8 is a schematic cross section view showing an example of a circuit device according to the first exemplary embodiment of the present invention.
Figure 8B:
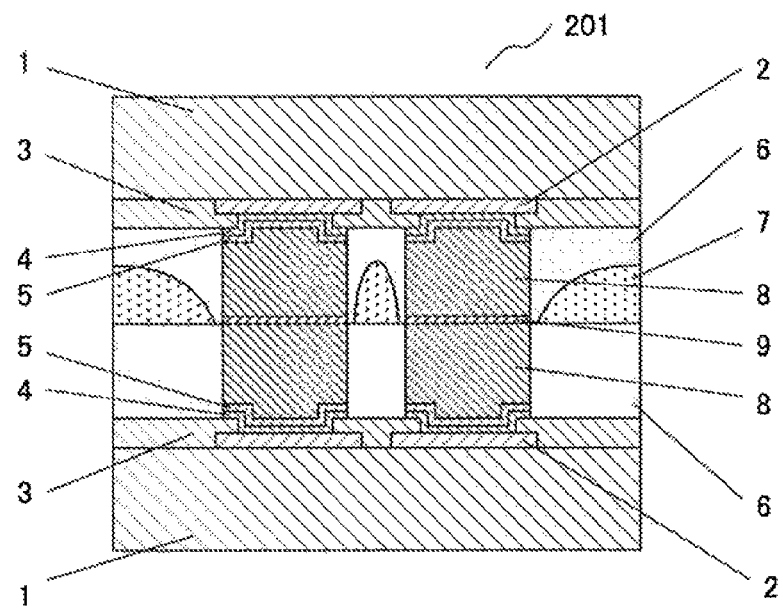
Figure 9A:
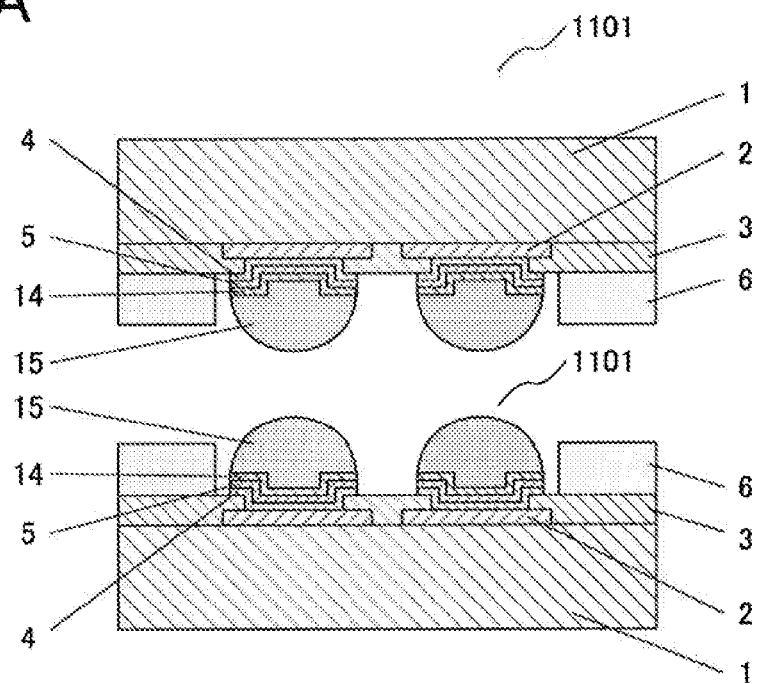
FIG. 9 is a schematic cross section view showing joining structure and a joining method of a semiconductor device according to a related art.
Figure 9B:
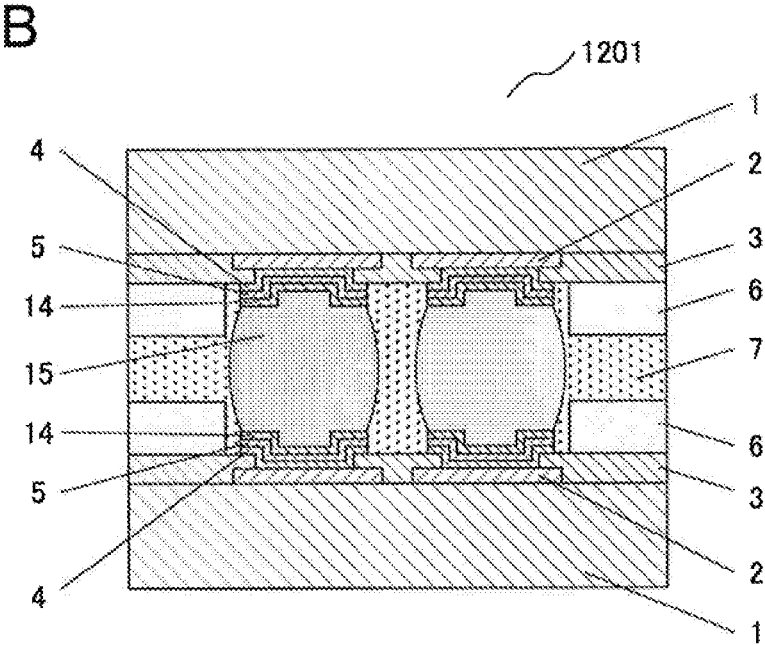

Next, a circuit device which uses the semiconductor device according to the exemplary embodiment of the present invention will be described in detail with reference to FIG. 8. First, a position of the semiconductor device 101 according to the exemplary embodiment of the present invention and a position of a semiconductor device 102, the surface of the main material part 8 of the bump and of which the surface of the protecting film 6 form the same plane, are adjusted (FIG. 8A). Afterward, a circuit device 201 is produced through making the joining material part 9 of the semiconductor 101 and the main material part 8 of the bump of the semiconductor 102 touch each other, and making the joining material part 9 and the metals of both main material parts react and join together by adding heat and pressure (FIG. 8B). At this time, through heating and hardening thermally also the bonding resin layer 7, a bonding over all boundary between the semiconductor devices is completed.

According to the circuit device of the exemplary embodiment 1 of the present invention, through forming the bonding resin layer in advance, connecting the electrode electrically, filling the resin into the joining part and hardening the resin are carried out simultaneously when the components are mounted. As a result, it is possible to achieve the high productivity. Moreover, through mounting members whose surfaces are flat, occurrence of void can be suppressed within the resin due to involving air when the components are mounted even if the electrode pitch is fine and the gap is narrow.

While the structure related to the semiconductor devices is shown in the exemplary embodiment, the present invention is not limited to this. That is, the present exemplary embodiment may relate to joining the semiconductor device with the substrate or to joining the substrates together. Moreover, the circuit device may include the semiconductor devices 101, which are joined to each other, according to the present invention. Furthermore, the circuit device may include the structure in which the joining part and another part form the same plane, to which the structure of the semiconductor device according to the present invention is connected. In this case, the similar effect is obtained. Moreover, the joining material part may be supplied to both semiconductor devices.

Second Exemplary Embodiment

Next, a second exemplary embodiment will be described with reference to FIG. 2. FIG. 2 is a cross section view of a semiconductor device 103 according to the exemplary embodiment 2. As shown in FIG. 2, the semiconductor device 103 according to the present exemplary embodiment is different from the semiconductor device 101 according to the first exemplary embodiment in a point that one side surface of the protecting film 6 (side surface of semiconductor device) is covered with the bonding resin layer 7. Here, FIGS. 2A and 2B in FIG. 2 shows cross section views of two kinds of the semiconductor devices 103.

According to the present exemplary embodiment, since the side surface of the protecting film (side surface of semiconductor device) is covered with the bonding resin layer, an internal stress, which is generated by an external force and a difference of the thermal expansion after mounting the components on the semiconductor device 103, is relaxed by the bonding resin layer 7. As a result, an exfoliation of surface is suppressed at the side surface of the protecting film 6 as a starting point.

[Manufacturing Method]

Next, a method for manufacturing the semiconductor device according to the present exemplary embodiment will be described with reference to FIGS. 3 and 5.

According to the present exemplary embodiment, since processes up to supplying the protecting film 6 are the same as in the manufacturing method according to the first exemplary embodiment (from FIG. 3A to FIG. 3D), description on the processes will be omitted.

Figure 5E:
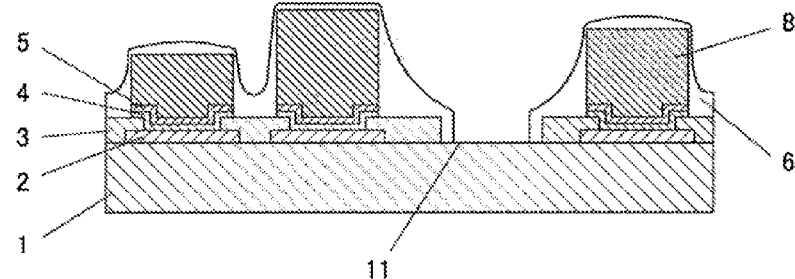
FIG. 5 is a schematic cross section view showing an example of a method for manufacturing the semiconductor device according to the second exemplary embodiment of the present invention.
Figure 5F:
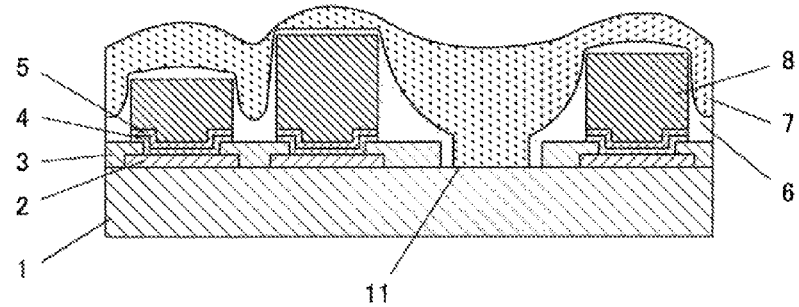

Next, along the dicing line 11 of a portion which is cut into a piece from the wafer, the protecting film 6 is removed with the laser method or the like (FIG. 5E). In the case that the organic resin such as photosensitive polyimide is applied to the protecting film 6, the exposure and the development may be carried out so that an opening may be formed on the dicing line 11 when hardening the resin. Afterward, the resin, which changes to the bonding resin layer 7, is supplied (FIG. 5F). In the case that the thermal hardening resin or the thermoplastic resin is applied to the bonding resin layer 7, the resin in the shape of film may be laminated on the protecting film 6. Here, in the case that the thermal hardening resin is applied, the resin is in the semi hard state after being laminated.

As a method to supply the bonding resin layer 7, a method of forming the bonding resin layer 7 in the semi hard state through supplying the liquid type thermal hardening resin on the protecting film 6 by the spin coat or the like, and heating the resin may be adopted. Moreover, in the case that the thermal hardening and photosensitive resin is applied to the bonding resin layer 7, a method of forming the bonding resin layer 7 in the semi hard state through supplying the resin by the spin coat or the like and exposing the resin may be adopted.

Figure 5G:
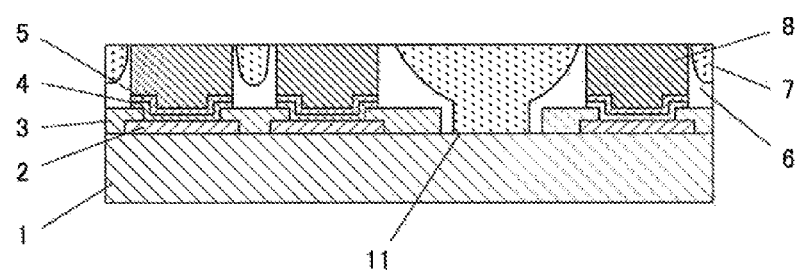
Figure 5H:
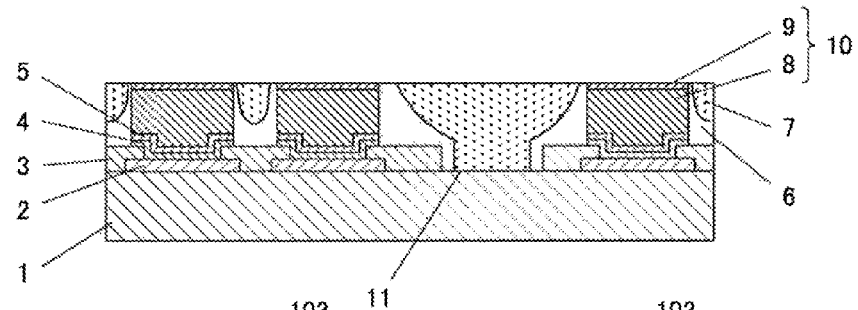

Next, the flattening process is carried out for the bonding resin layer 7, the protecting film 6 and the main material part 8 of the bump 10 by use of the polishing method, the grinding method, the chemical mechanical polishing method or the like (FIG. 5G). Furthermore, metal which will be the thin film shape joining material part 9 is supplied on the exposed surface of the main material part 8 with the electroless plating method or the like (FIG. 5H). Here, in the case that the electroless plating method is adopted, the joining material part 9, which has the desired plating thickness, may be supplied by use of the immersion plating bath. Moreover, Au, Sn or an alloy thereof may be applied to the joining material part 9.

Figure 5I:
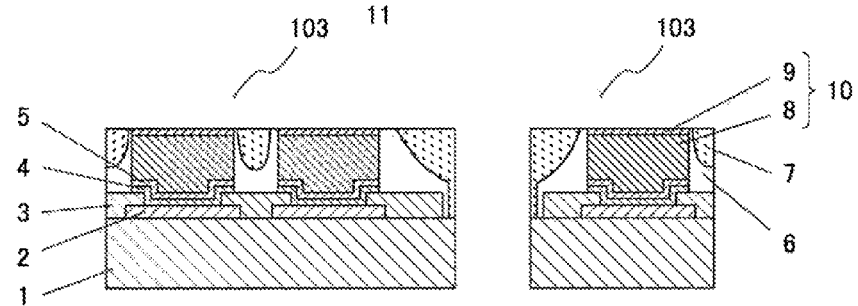

Finally, through the dicing process along the dicing line 11, the wafer is cut into a plurality of pieces. Through the dicing process, the semiconductor device 103 according to the second exemplary embodiment of the present invention is produced (FIG. 5I). Moreover, the back surface of the semiconductor element 1 may be processed with the polishing method or the like so that the wafer may have the desired thickness, and afterward the dicing process is carried out.

According to the manufacturing method of the present exemplary embodiment, through carrying out the dicing process in the state that the protecting film along the dicing line is removed in advance, the exfoliation of the protecting film, which may occur in the dicing process, is prevented.

Third Exemplary Embodiment

Next, a method of manufacturing a semiconductor device according to a third exemplary embodiment will be described with reference to FIG. 3 and FIG. 6.

As shown in FIG. 3 and FIG. 6, a method for manufacturing a semiconductor device 104 according to the present exemplary embodiment is different from the method for manufacturing the semiconductor device according to the first exemplary embodiment or the second exemplary embodiment in a point that the process for flattening the main material part 8 of the bump 10 is carried out and the joining material part 10 is formed before the resin which changes to the bonding resin layer 7 is supplied. The present exemplary embodiment will be described specifically in the following. According to the present exemplary embodiment, since processes up to supplying the protecting film 6 are the same as in the first or the second exemplary embodiment (FIG. 3A to FIG. 3D), description on the processes will be omitted.

Figure 6E:
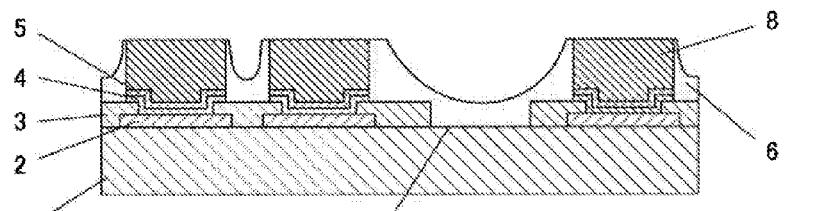
FIG. 6 is a schematic cross section view showing an example of a method for manufacturing a semiconductor device according to a third exemplary embodiment of the present invention.
Figure 6F:
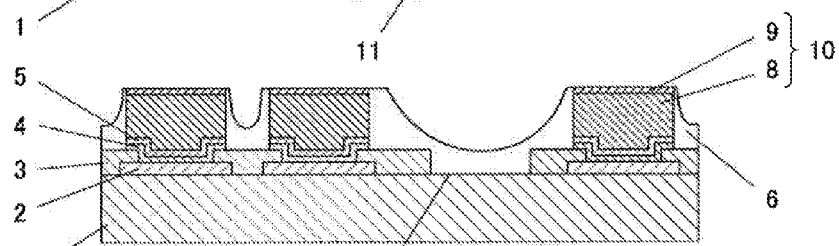

Next, the flattening process is carried out for the protecting film 6 and the main material part 8 of the bump 10 with the polishing method, the grinding method, the chemical mechanical polishing method or the like (FIG. 6E). Furthermore, metal which will be the thin film shape joining material part 9 is supplied on the surface of the main material part 8, which is exposed from the protecting film 6, with the electroless plating method or the like (FIG. 6F). Here, in the case that the electroless plating method is adopted, the joining material part 9, which has the desired plating thickness, may be supplied by use of the immersion plating bath. Moreover, Au, Sn or the alloy thereof may be applied to the joining material part 9.

Figure 6G:
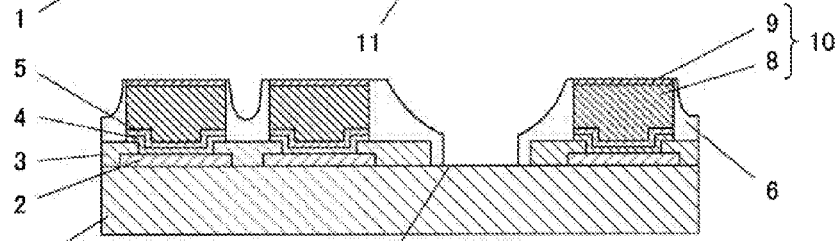

Afterward, on the dicing line 11 of a portion which is cut into the piece from the wafer, the protecting film 6 is removed with the laser method or the like (FIG. 6G). In the case that the organic resin such as photosensitive polyimide is applied to the protecting film 6, the exposure and the development may be carried out so that an opening may be formed on the dicing line 11 when hardening the resin.

Figure 6H:
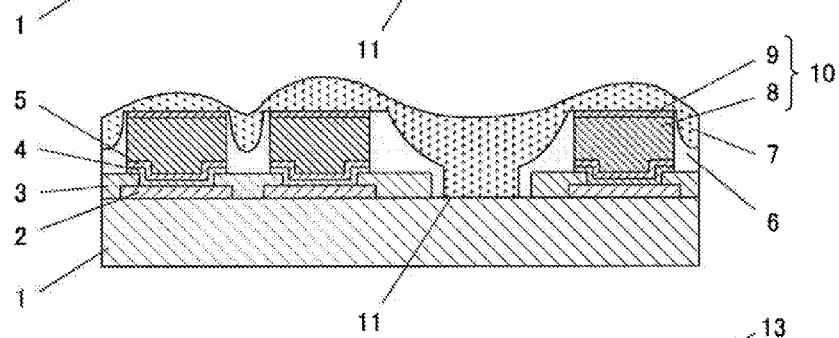

Next, the resin which changes to the bonding resin layer 7 is supplied (FIG. 6H). In the case that the thermal hardening resin or the thermoplastic resin is applied to the bonding resin layer 7, for example, the resin in the shape of film is preferably laminated on the protecting film 6. Here, in the case that the thermal hardening resin is applied, the resin is still in the semi hard state also after being laminated. As a method to supply the bonding resin layer 7, a method that the liquid type thermal hardening resin or the liquid type thermal hardening and photosensitive resin is supplied on the protecting film 6 by the spin coat or the like may be adopted.

Figure 6I:
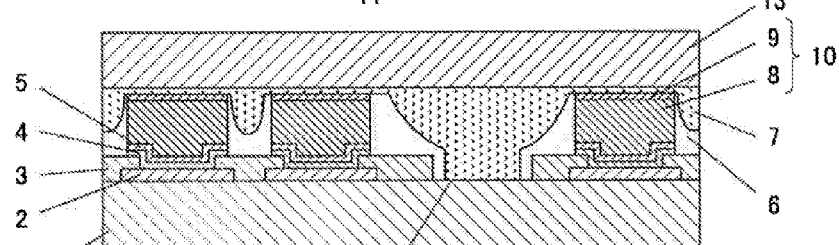

Afterward, the resin which changes to the bonding resin layer 7 is shaped through pressing with a mask 13 having a flat shape. After shaping the resin, a residual of the bonding resin which remains on the surface of the joining material part 9 is removed and the joining material part 9 is exposed with the dry etching method (FIG. 6I). Here, in the case that the thermal hardening resin or the thermoplastic resin is applied to the bonding resin layer 7, the bonding resin layer 7 is preferably formed through pressing with the mask 13 and shaping while heating the resin. Moreover, in the case that the thermal hardening resin is used, the shaping is performed preferably with the temperature and the time so that the thermal hardening resin will be semi hard also after being shaped. Meanwhile, in the case that the thermal hardening and photosensitive resin is applied, the resin is exposed with pressing, for example, with the mask 13 made of glass or the like.

Figure 6J:
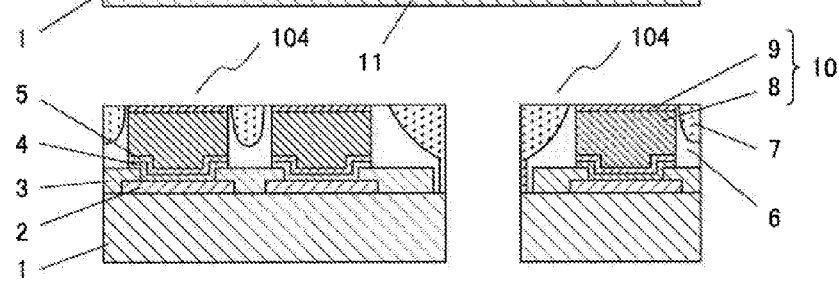

Finally, through carrying out the dicing process along the dicing line 11, the wafer is cut into a plurality of pieces. Through carrying out the dicing process, the semiconductor device 104 according to the third exemplary embodiment of the present invention is produced (FIG. 6J). Moreover, the back surface of the semiconductor element 1 may be processed with the polishing method or the like so that the wafer may have the desired thickness, and afterward the dicing process is carried out.

According to the manufacturing method of the present exemplary embodiment, the process for flattening the main material part 8 of the bump 10 is carried out before the resin which changes to the bonding resin layer 7 is supplied, and the joining material part 10 is formed. As a result, influence on the resin physical properties of the bonding resin layer, by the plating solvent when forming the bonding material part with the electroless plating method or the like, can be prevented.

Fourth Exemplary Embodiment

Next, a method for manufacturing a semiconductor device according to a fourth exemplary embodiment will be described with reference to FIG. 3 and FIG. 7.

As shown in FIG. 3 and FIG. 7, a method for manufacturing a semiconductor device 105 according to the present exemplary embodiment is different from the method for manufacturing the semiconductor device according to the first, second or third exemplary embodiment in a point that the bonding resin layer 7 along the dicing line 11 is removed when shaping the bonding resin layer 7.

The present exemplary embodiment will be described specifically in the following. According to the present exemplary embodiment, since processes up to supplying the resin, which changes to the bonding resin layer 7, are the same as in the manufacturing method according to the third exemplary embodiment (FIGS. 3A to 3D and FIGS. 7E to 7H), description on the processes will be omitted.

Figure 7E:
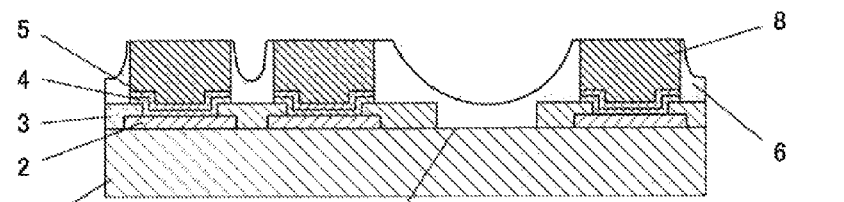
FIG. 7 is a schematic cross section view showing an example of a method for manufacturing a semiconductor device according to a fourth exemplary embodiment of the present invention.
Figure 7F:
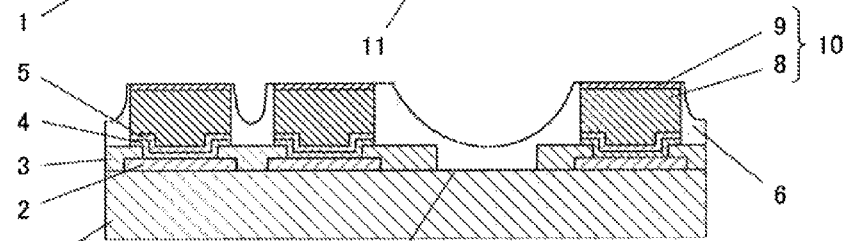
Figure 7G:
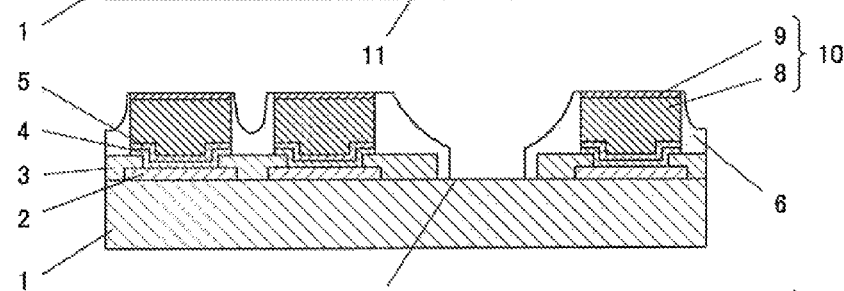
Figure 7H:
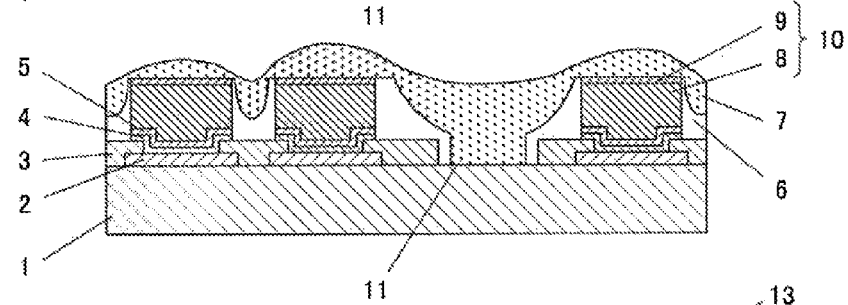
Figure 7I:
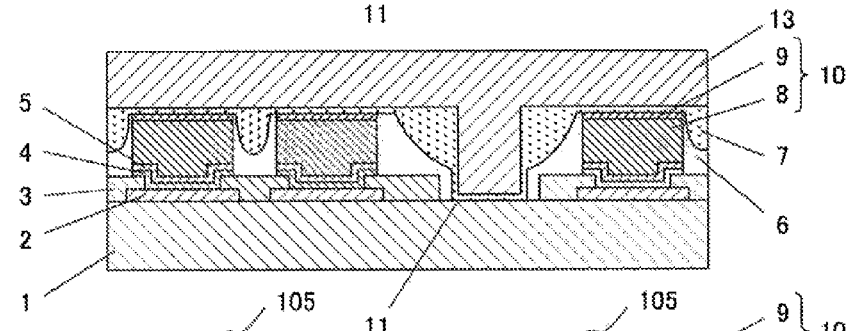

Next, the mask 13, which has a projection, is pressed on a portion on the dicing line 11, and the resin which changes to the bonding resin layer 7 is shaped. After shaping the resin, a residual of the bonding resin, which remains on the surface of the joining material part 9 and at a position near to the dicing line 11, is removed with the dry etching method or the like, and then the joining material part 9 and the dicing line are exposed (FIG. 7I). Here, in the case that the thermal hardening resin or the thermoplastic resin is applied to the bonding resin layer 7, the bonding resin layer 7 is formed through pressing with the mask 13 and shaping while heating the resin. Moreover, in the case that the thermal hardening resin is used, the shaping is performed preferably with the temperature and the time so that the thermal hardening resin will be semi hard also after being shaped. Meanwhile, in the case that the thermal hardening and photosensitive resin is applied, the resin is exposed while pressing, for example, with the mask 13 made of glass or the like having the similar shape.

Moreover, in the case that the thermal hardening and photosensitive resin is applied, the exposure and the development may be carried out while pressing the resin with the mask 13 having a flat shape so that the dicing line portion 11 may be opened.

Figure 7J:
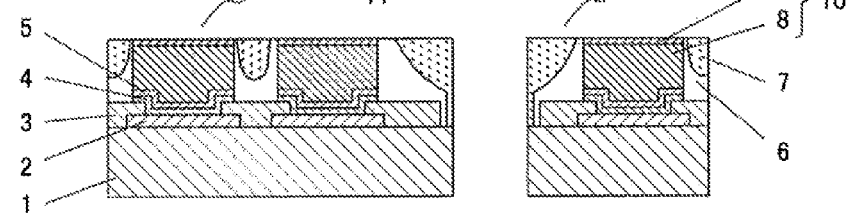

Finally, through carrying out the dicing process along the dicing line 11, the wafer is cut into a plurality of pieces. Through carrying out the dicing process, the semiconductor device 105 according to the fourth exemplary embodiment of the present invention is produced (FIG. 7J). Moreover, the back surface of the semiconductor element 1 may be processed with the polishing method or the like so that the wafer may have the desired thickness, and afterward the dicing process is carried out.

According to the manufacturing method of the present exemplary embodiment, on shaping the bonding resin layer 7, through removing the bonding resin layer supplied on the portion of the dicing line, it is possible to prevent the dicing blade from being clogged with the resin when the wafer is cut into a plurality of pieces in the dicing process. Accordingly, occurrence of a chipping or crack of the semiconductor element, which occurs in the dicing process, can be prevented, and the reliability is improved.

Example

Next, an example on a method for manufacturing a semiconductor device according to the present invention will be described with reference to FIG. 3 and FIG. 4.

Firstly, the semiconductor element 1, for example, has a shape of wafer whose diameter is 8 inches and whose thickness is 725 micrometers, and includes, for example, on the circuit plane, an electrode 2 made of Al arranged in a pitch area array of 20 micrometers, and an insulating film 3 made of SiON, which has an opening on a part of the electrode 2 and covers the circuit plane (FIG. 3A).

Next, an adhering layer 4 made of Ti, and a bonding layer 5 made of Cu are formed on whole surfaces of the electrode 2 and the insulating film 3 with the sputtering method. Then, photosensitive resist 12 is supplied on the bonding layer 5 by the spin coat, and afterward the exposure and the development are carried out. As a result, the opening whose diameter is, for example, 10 micrometers is formed on the electrode 2. Moreover, Cu, which will be the main material part 8, is extracted on the opening of the resist 12 with the electrolysis plating method. A height of the extracted Cu is, for example, not lower than 10 micrometers (FIG. 3B). At this time, heights of the main material part 8 vary among the electrodes 2.

Afterward, the resist 12 is removed, and furthermore the adhering layer 4 and the bonding layer 5 except for the adhering layer 4 and the bonding layer 5 which are formed under the main material part 8 are removed with the wet etching method (FIG. 3C). Next, organic resin of polyimide which changes to the protecting film 6 is supplied on a whole of surface, which includes the surface of the main material part 8, from the upper side, and afterward the resin is hardened thermally (FIG. 3D). An proper amount of the polyimide resin is supplied so that a thickness of the protecting film 6, which has been shaped, on the insulating film 3 is, for example, 3 micrometers. Afterward, the film shape thermal hardening resin, which changes to the bonding resin layer 7 and which is, for example, 30 micrometers thick, is supplied on the protecting film 6 with the vacuum laminate method with the heating temperature of 85 degrees centigrade and the vacuum pressure of 0.5 megapascals (MPa) (FIG. 4E). The resin is still in the semi hard state also after being laminated.

Next, the flattening process is carried out for the bonding resin layer 7, the protecting film 6 and the main material part 8 with the grinding method (FIG. 4F). The height of the main material part 8 is 8 micrometers after the flattening process. Furthermore, the joining material part 9, made of Au in a shape of thin film, is formed on the exposed surface of the main material part 8 with the electroless plating method by use of the immersion Au plating bath (FIG. 4G). The thin film shape Au is, for example, 0.03 micrometers thick. Finally, the back surface of the semiconductor element 1 is polished with the polishing method to make thin so that the thickness becomes 120 micrometers, and the dicing process is carried out to cut the wafer into a plurality of rectangles with a size of 8 millimeters square. As a result, the semiconductor device according to the example of the present invention is obtained (FIG. 4H).

[Circuit Device]

Next, an example on a method for manufacturing a circuit device according to the present invention will be described with reference to FIG. 8.

As shown in FIG. 8, a position of the semiconductor device 101 according to the present exemplary embodiment of the present invention and a position of the semiconductor device 102, in which the surface of the main material part 8 made of Cu with a diameter of 13 micrometers, and the surface of the protecting film 6 made of polyimide form the same plane, are adjusted (FIG. 8A). Afterward, the joining material part 9 made of Au in the semiconductor device 101, and the main material part 8 in the semiconductor 102 are touched each other, and are heated at the temperature of 300 degrees centigrade and are simultaneously pressed with a mounting load of 75 newtons per chip for 15 seconds, then the joining material part 9 and the main material parts 8 of both semiconductor devices react and are joined together (FIG. 8B). At this time, through the bonding resin layer 7 starting the reaction at the temperature, which is not lower than 150 degrees centigrade, to be hardened thermally, a process to bond the semiconductor devices together is completed.

In the first viewpoint, the bump preferably includes two layers of the main material part and the joining material part.

The main material part is preferably made of Cu. Moreover, the joining material part of the bump is preferably any one of Au and Sn.

At least one side surface of the semiconductor device is preferably covered with the bonding resin layer so as not to expose the protecting film.

The protecting film has preferably an arcuate shape which is concave at a center between two adjacent bumps.

The organic film made of polyimide may be applied to the protecting film. The protecting film may be an inorganic film.

The thickness of the protecting film is preferably not more than a half of the height of the bump at a position between the bumps.

The bonding resin layer is preferably made of at least one of the thermal hardening resin in the semi hard state, the thermal hardening and photosensitive resin, and the thermoplastic resin.

In the second viewpoint, it is preferable to further include a process to remove the protecting film on the dicing line, between the process to form the protecting film on the insulating layer of the semiconductor element and on the main material part of the bump, and the process to supply the material, which changes to the bonding resin layer, on the protecting film.

It is preferable to further include a process to form the joining material part on the surface of the main material part of the bump.

In the third viewpoint, it is preferable to further include a process to form the joining material part on the surface of the main material part of the bump.

Moreover, the process to form the joining material part on the surface of the main material part of the bump is preferably carried out with the electroless plating method by use of the immersion plating bath.

The process to supply the material which changes to the bonding resin layer is preferably a process to supply the film shape semi hard resin with the laminate method.

The process to supply the material which changes to the bonding resin layer is preferably a process to supply the liquid resin by the spin coat and afterward to make the liquid resin semi hard by heating or exposing.

The process to flatten the surface of the main material part of the bump and the surface of the protecting film (including the bonding resin layer) near to the main material part of the bump to make the surfaces form the same plane is preferably carried out with at least one of the polishing method, the grinding method and the chemical mechanical polishing method.

The process to remove the protecting film on the dicing line is preferably carried out with any one of the laser method and the photolithography method.

The process to shape the resin, which changes to the bonding resin layer, by use of the mask is preferably carried out through pressing the resin with the mask which has the projection on the dicing line, and shaping the resin.

The process to shape the resin, which changes to the bonding resin layer, by use of the mask is preferably carried out with the photolithography method by use of the mask having a flat shape.

While the invention has been particularly shown and described with reference to the exemplary embodiment and the example thereof, the invention is not limited to the exemplary embodiment and the example. It is possible to make various changes, which those of ordinary skill in the art can understand, in forms and details without departing from the spirit and scope of the present invention.

This application is based upon and claims the benefit of priority from Japanese Patent Application No. 2009-149945, filed on Jun. 24, 2009, the disclosure of which is incorporated herein in its entirety by reference.

INDUSTRIAL APPLICABILITY

The present invention can be applied to a semiconductor device which achieves a fine pitch and a high throughput, and a circuit device which uses the semiconductor device.

REFERENCE SIGNS LIST

1 Semiconductor element
2 Electrode
3 Insulating film
4 Adhering layer
5 Bonding layer
6 Protecting film
7 Bonding resin layer
8 Main material part
9 Joining material part
10 Bump
11 Dicing line
12 Resist
13 Mask
14 Barrier metal
15 Solder bump
101, 102, 103, 104, 105 and 1101 Semiconductor device
201 and 1201 Circuit device

The invention claimed is:

1. A semiconductor device having an electrode, comprising:
   an insulating part having an opening on said electrode;
   a protruding part formed on said electrode;
   a protecting part formed at a periphery of said protruding part and isolating electrically said protruding part; and
   a bonding part formed on said protecting part spaced apart from said protruding part, an upper surface of said protruding part, an upper surface of said protecting part and upper surface of said bonding part forming a same plane.

2. The semiconductor device according to claim 1, wherein said protruding part includes a main material part and a joining material part, and
   said joining material part is in a shape of layer and formed on said main material part.

3. The semiconductor device according to claim 2, wherein said main material part includes copper (Cu).

4. The semiconductor device according to claim 2, wherein said joining material part includes at least one of gold (Au) and tin (Sn).

5. The semiconductor device according to claim 1, wherein at least one surface of said protecting part is covered with said bonding part.

6. The semiconductor device according to claim 1, further comprising a plurality of protruding parts, wherein
   a cross section of said protecting part between said protruding parts has an arcuate curve.

7. The semiconductor device according to claim 1, wherein said protecting part includes an organic film including polyimide.

8. The semiconductor device according to claim 1, wherein said protecting part includes an inorganic film.

9. The semiconductor device according to claim 1, further comprising a plurality of protruding parts, wherein
   a thickness of said protecting part between said protruding parts is not more than a half of a height of said plurality of protruding parts.

10. The semiconductor device according to claim 1, wherein said bonding part includes at least one of thermal hardening resin in a semi hard state, thermal hardening and photosensitive resin and thermoplastic resin.

11. A circuit device, including a semiconductor device having an electrode,
    said semiconductor device including:
    an insulating part having an opening on said electrode;
    a protruding part formed on said electrode;
    a protecting part formed at a periphery of said protruding part and isolating electrically said protruding part; and
    a bonding part formed on said protecting part spaced apart from said protruding part,
    an upper surface of said protruding part, an upper surface of said protecting part and upper surface of said bonding part forming a same plane.

* * * * *